(12) United States Patent
Philippou et al.

(10) Patent No.: US 10,608,104 B2
(45) Date of Patent: Mar. 31, 2020

(54) TRENCH TRANSISTOR DEVICE

(71) Applicant: Infineon Technologies AG, Neubiberg (DE)

(72) Inventors: Alexander Philippou, Munich (DE); Johannes Georg Laven, Taufkirchen (DE); Christian Jaeger, Munich (DE); Frank Wolter, Munich (DE); Frank Pfirsch, Munich (DE); Antonio Vellei, Villach (AT)

(73) Assignee: Infineon Technologies AG, Neubiberg (DE)

( * ) Notice: Subject to any disclaimer, the term of this patent is extended or adjusted under 35 U.S.C. 154(b) by 54 days.

(21) Appl. No.: 14/228,881

(22) Filed: Mar. 28, 2014

(65) Prior Publication Data
US 2015/0279985 A1 Oct. 1, 2015

(51) Int. Cl.
*H01L 29/78* (2006.01)
*H01L 29/40* (2006.01)
(Continued)

(52) U.S. Cl.
CPC ...... *H01L 29/7813* (2013.01); *H01L 29/0619* (2013.01); *H01L 29/0696* (2013.01);
(Continued)

(58) Field of Classification Search
None
See application file for complete search history.

(56) References Cited

U.S. PATENT DOCUMENTS 4,994,871 A * 2/1991 Chang ................ H01L 29/0692
257/139
5,801,408 A 9/1998 Takahashi
(Continued)

FOREIGN PATENT DOCUMENTS

CN 203481241 U 3/2014
DE 102012100349 A1 7/2012
(Continued)

OTHER PUBLICATIONS

Momose et al, "A 600V Super Low Loss IGBT with Advanced Micro-P Structure for the Next Generation IPM." Proceedings of the 22nd International Symposium on Power Semiconductor Devices & ICs, Hiroshima, pp. 379-382.
(Continued)

*Primary Examiner* — Samuel A Gebremariam
*Assistant Examiner* — Jonas T Beardsley
(74) *Attorney, Agent, or Firm* — Murphy, Bilak & Homiller, PLLC

(57) ABSTRACT

A transistor device includes a semiconductor mesa region between first and second trenches in a semiconductor body, a body region of a first conductivity type and a source region of a second conductivity type in the semiconductor mesa region, a drift region of the second conductivity type in the semiconductor body, and a gate electrode adjacent the body region in the first trench, and dielectrically insulated from the body region by a gate dielectric. The body region separates the source region from the drift region and extends to the surface of the semiconductor mesa region adjacent the source region. The body region comprises a surface region which adjoins the surface of the semiconductor mesa region and the first trench. The surface region has a higher doping concentration than a section of the body region that separates the source region from the drift region.

26 Claims, 5 Drawing Sheets

(51) Int. Cl.
*H01L 29/06* (2006.01)
*H01L 29/08* (2006.01)
*H01L 29/10* (2006.01)
*H01L 29/417* (2006.01)
*H01L 29/423* (2006.01)
*H01L 29/739* (2006.01)

(52) U.S. Cl.
CPC ...... *H01L 29/0834* (2013.01); *H01L 29/1095* (2013.01); *H01L 29/402* (2013.01); *H01L 29/407* (2013.01); *H01L 29/41741* (2013.01); *H01L 29/4236* (2013.01); *H01L 29/7397* (2013.01); *H01L 29/7811* (2013.01); *H01L 29/7841* (2013.01)

(56) References Cited

U.S. PATENT DOCUMENTS

| | | | |
|---|---|---|---|
| 6,262,470 B1 | 7/2001 | Lee et al. | |
| 6,399,998 B1* | 6/2002 | Chang | H01L 29/1095 257/139 |
| 6,429,481 B1* | 8/2002 | Mo et al. | 257/341 |
| 7,675,113 B2 | 3/2010 | Sakamoto et al. | |
| 7,737,491 B2 | 6/2010 | Hotta et al. | |
| 7,800,168 B2* | 9/2010 | Ogura et al. | 257/330 |
| 2001/0048132 A1* | 12/2001 | Ito | H01L 29/0696 257/330 |
| 2002/0006703 A1* | 1/2002 | Pfirsch | H01L 29/045 438/268 |
| 2002/0179976 A1* | 12/2002 | Takahashi | H01L 29/407 257/370 |
| 2003/0020134 A1* | 1/2003 | Werner | H01L 27/0705 257/471 |
| 2005/0045960 A1* | 3/2005 | Takahashi | 257/368 |
| 2006/0231904 A1* | 10/2006 | Kocon | H01L 21/823487 257/391 |
| 2008/0012040 A1 | 1/2008 | Saito | |
| 2009/0008674 A1* | 1/2009 | Udrea | H01L 29/0696 257/138 |
| 2010/0072544 A1* | 3/2010 | Pearse et al. | 257/331 |
| 2014/0048847 A1 | 2/2014 | Yamashita et al. | |

FOREIGN PATENT DOCUMENTS

| | | |
|---|---|---|
| DE | 112011100533 T5 | 12/2012 |
| EP | 0962987 A2 | 8/1999 |
| EP | 1155458 B1 | 11/2001 |

OTHER PUBLICATIONS

Nakamura et al, "Advanced Wide Cell Pitch CSTBTs Having Light Punch-Through (LPT) Structures," Fukuoka, Japan, 819-0192, pp. 1-4.

Takahashi et al, "1200V Reverse Conducting IGBT," Proceedings of 2004 International Symposium on Power Semiconductor Devices and ICs, Mitsubishi Electric Corporation, Fukuoka 819-01 Japan, pp. 133-136.

* cited by examiner

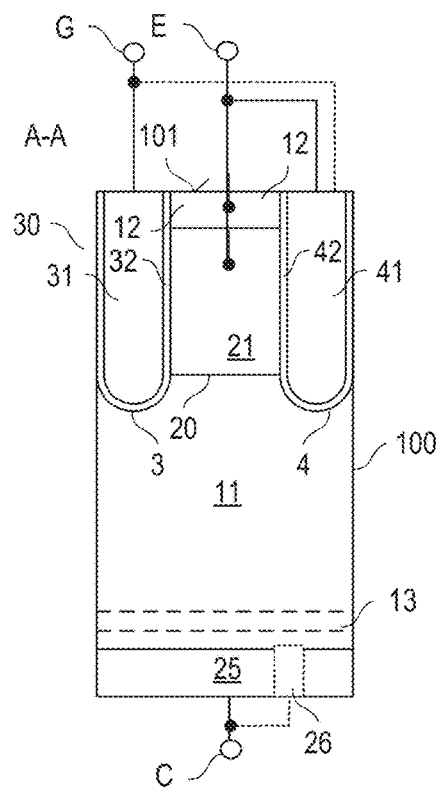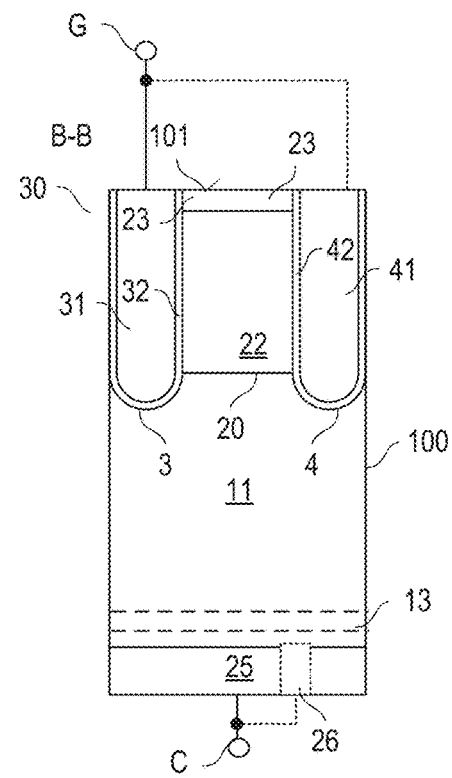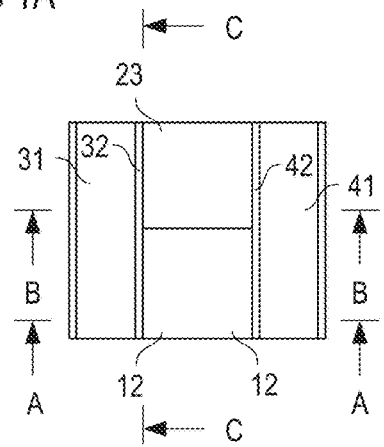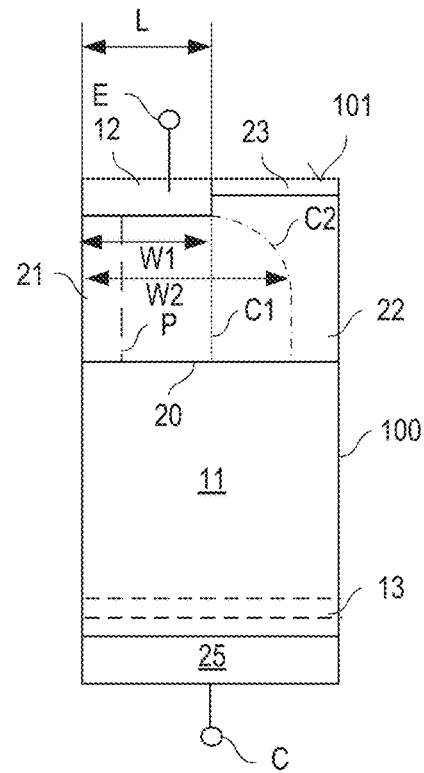
FIG 1A
FIG 1B
FIG 1C
FIG 2

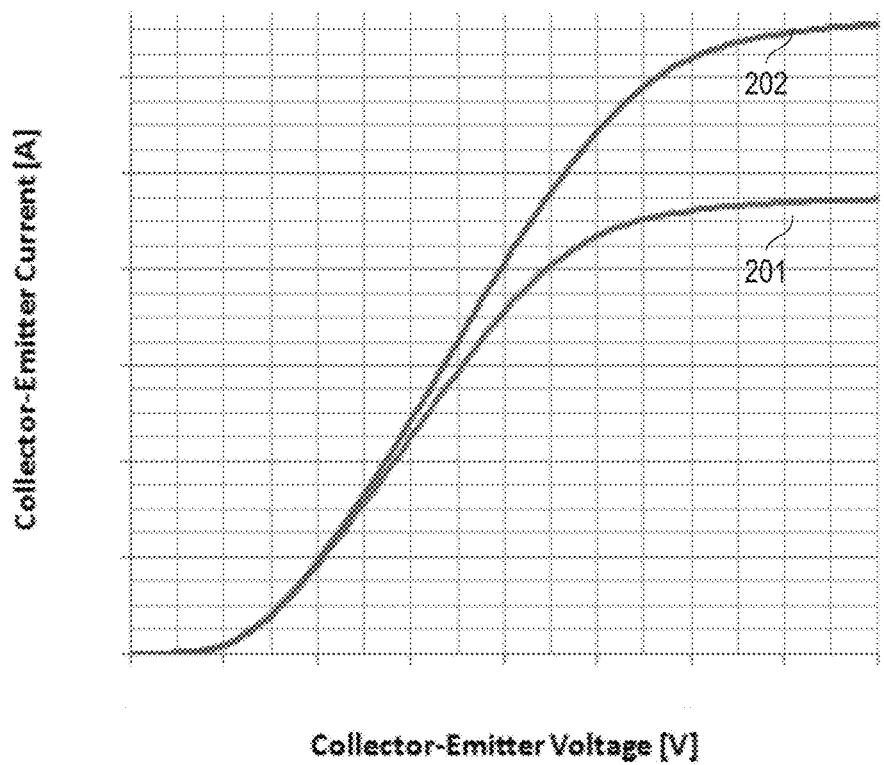
FIG 3
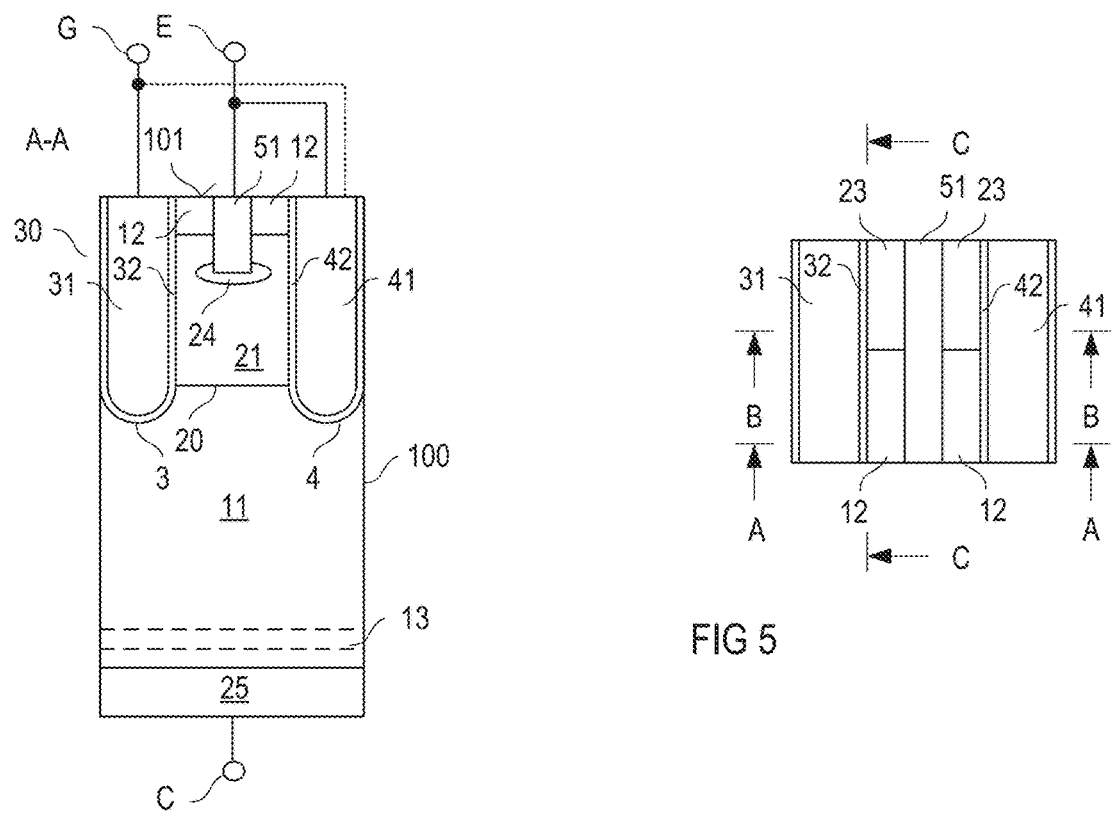
FIG 4
FIG 5

TRENCH TRANSISTOR DEVICE

TECHNICAL FIELD

This disclosure in general relates to a transistor device and, more specifically, to a transistor device including a semiconductor mesa region which includes a source region and a body region.

BACKGROUND

Transistors devices such as IGBTs (Insulated Gate Bipolar Transistors) or MOSFETs (Metal Oxide Semiconductor Field-Effect Transistors) are widely used for switching different types of electric loads. For example, transistor devices may be employed in power conversion applications, electric drive applications, or lighting applications, to name only a few.

An IGBT is a voltage controlled MOS transistor device that includes a collector region (often referred to as drain region) and an emitter region (often referred to as source region) that have complementary doping types (conductivity types). An IGBT further includes a gate electrode which is dielectrically insulated from a body region by a gate dielectric, is adjacent the body region, and extends adjacent the body region from the emitter region to a base region (drift region). The base region is arranged between the body region and the collector region. In the on-state of the IGBT the gate electrode generates a conducting channel in the body region between the emitter region and the drift region so that the emitter region can inject charge carriers of a first conductivity type into the drift region. At the same time, the collector region injects charge carriers of a second conductivity type into the drift region, with the charge carriers of the first and second conductivity types forming a charge carrier plasma in the drift region. This charge carrier plasma results in relatively low conduction losses of the IGBT.

Relevant operation parameters of an IGBT are the saturation voltage (often referred to as $V_{CEsat}$) and the saturation current (often referred to as $I_{CEsat}$). The saturation voltage is the voltage between the emitter and collector region of the IGBT at a typical current (rated current) in a normal operation mode of the IGBT. The saturation voltage characterizes the power losses that occur in a normal operation mode of the IGBT. The saturation current is the current that occurs at voltages much higher than the saturation voltage. The saturation current characterizes the behaviour of the IGBT in an overload scenario such as, for example, a short-circuit in the load. A high current in an overload scenario may damage associated circuitry.

It is desirable to design an IGBT with a low saturation voltage and a low saturation current, so as to have low losses in the normal operation mode and a low risk of damages in associated circuitry. However, conventional design measures that reduce the saturation voltage increase the saturation current. It is therefore desirable to adjust the saturation voltage of an IGBT widely independent of the saturation current.

SUMMARY

One embodiment relates to a transistor device. The transistor device includes a semiconductor mesa region between a first trench and a second trench in a semiconductor body, a body region of a first conductivity type and a source region of a second conductivity type in the semiconductor mesa region, a drift region of the second conductivity type in the semiconductor body, and a gate electrode adjacent the body region in the first trench and dielectrically insulated from the body region by a gate dielectric. The body region separates the source region from the drift region and extends to the surface of the semiconductor mesa region adjacent the source region. The body region comprises a surface region which adjoins the surface of the semiconductor mesa region and the first trench. The surface region has a higher doping concentration than a section of the body region that separates the source region from the drift region.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIGS. 1A-1C show vertical cross sectional views (FIGS. 1A-1B) and a top view (FIG. 1C) of a section of a transistor device in accordance with one embodiment;

FIG. 2 shows a vertical cross sectional view of the transistor device shown in FIGS. 1A-1C and 2 in order to illustrate one way of operation of the transistor device;

FIG. 3 shows characteristic curves of a transistor device according to one embodiment versus a conventional transistor device;

FIG. 4 illustrates a vertical cross sectional view of an IGBT that includes a contact electrode arranged in a trench;

FIG. 5 shows a top view of one embodiment of the transistor device shown in FIG. 4;

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 10:
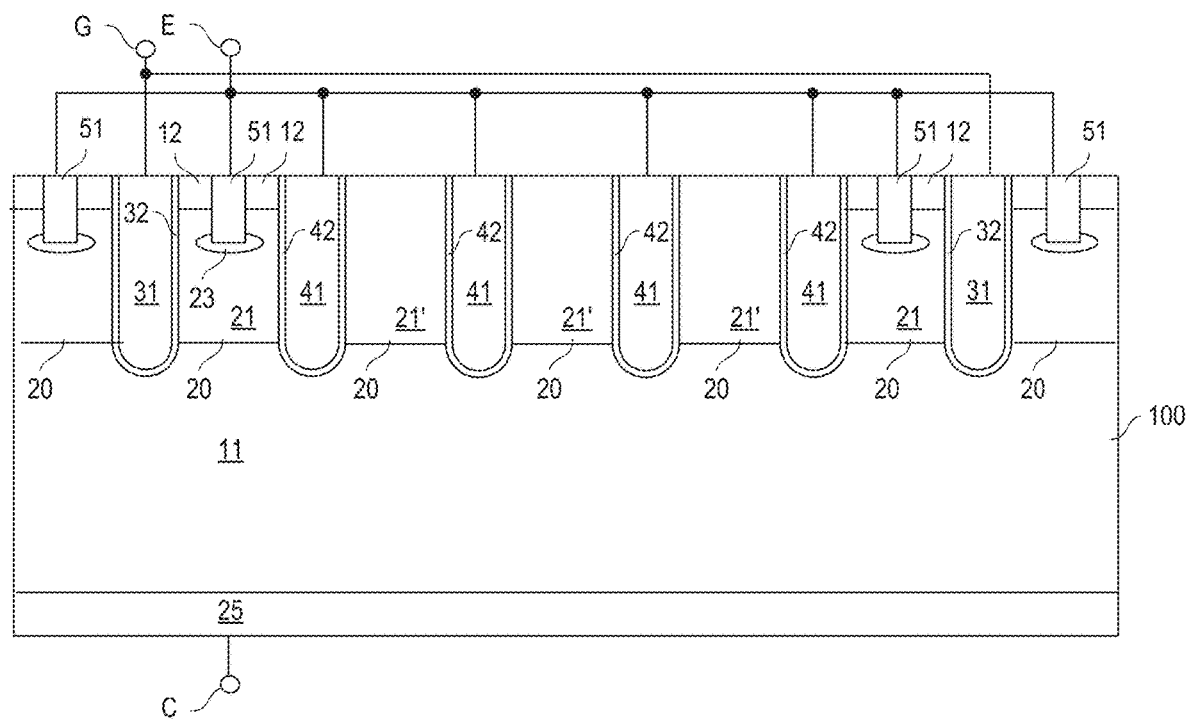
FIG. 10 shows a vertical cross sectional view of a transistor device according to yet another embodiment.

FIGS. 1A-1C show different views of one section of a transistor device according to one embodiment. FIG. 1A shows a vertical cross sectional view of the section of the transistor device in a section plane A-A, FIG. 1B shows a vertical cross sectional view in a section plane B-B different from section plane A-A, and FIG. 10 shows a top view. Referring to FIGS. 1A-1C the transistor device includes a semiconductor body 100. The semiconductor body 100 may include a conventional semiconductor material such as, for example, silicon (Si), silicon carbide (SiC), gallium arsenide (GaAs), gallium nitride (GaN), or the like.

The semiconductor body 100 includes a semiconductor mesa region between a first trench 3 and a second trench 4. Each of the first trench 3 and the second trench 4 extends from a surface into the semiconductor body 100. The semiconductor mesa region includes a body region 20 of a first conductivity type (doping type) and a source region 12 of a second conductivity type (doping type), complementary to the first conductivity type. A gate structure 30 with a gate electrode 31 and a gate dielectric 32 is arranged in the first trench 3. The gate electrode 31 is adjacent the body region 20 and is dielectrically insulated from the body region 20 by the gate dielectric 32. The gate electrode 31 may include a conventional gate electrode material such as, for example, a metal or a highly doped polycrystalline semiconductor material. The gate dielectric may include a conventional gate dielectric material such as, for example, an oxide. The gate electrode 31 serves to control a conducting channel in the body region 20 between the source region 12 and a drift region 11. This is explained in greater detail herein below. The drift region 11 adjoins the body region 20 and has the second conductivity type, which is the conductivity type of the source region 12.

Referring to FIG. 1A, the body region 20 separates the source region 12 from the drift region 11. That is, in a vertical direction of the semiconductor body 100, the body region section 21 is located between the source region 12 and the drift region 11. The "vertical direction" of the semiconductor body 100 is a direction perpendicular to the surface 101 of the semiconductor mesa region. In FIG. 1A, reference character 21 denotes that section of the body region 20 which separates the source region 12 from the drift region 11. This section 21 will be referred to as first section 21 in the following.

Adjacent the source region 12, the body region 20 extends to the surface 101 of the semiconductor mesa region. In those regions, were the body region 20 adjoins the surface 101, the body region 20 includes a surface region 23 which has a higher doping concentration than the first body region section 21 which separates the source region 12 from the body region 11. From the first trench 3 and the second trench 4 the surface region 23 at least adjoins the first trench 3 with the gate electrode 31 and the gate dielectric 32. That is, the surface region 23 at least adjoins the gate dielectric 32 in the first trench 3. According to one embodiment, the surface region 23, in a lateral direction of the semiconductor mesa region, extends from the first trench 3 to the second trench 4. This is illustrated in FIGS. 1B-1C.

A width of the semiconductor mesa region, which is a dimension of the semiconductor mesa region in the lateral direction (perpendicular to the longitudinal direction), is, for example, between 100 nanometers and 2000 nanometers (2 micrometers).

Referring to FIG. 1A, the source region 12 and the body region 20 are electrically connected to an emitter node (emitter terminal) E, and the gate electrode 31 is electrically connected to a gate node (gate terminal) G. The electrical connection of the body region 20 and the source region 12 to the emitter node E is only schematically shown in FIG. 1A. One embodiment for connecting the body region 20 and the source region 12 to the emitter node E is explained with reference to FIGS. 3-5 below.

Referring to FIGS. 1A-1B, the transistor device further includes a drain region (collector region) 25. The drain region 25 is separated from the body region 20 by the drift region 11. Optionally, the transistor device further includes a field-stop region 13 of the same conductivity type as the drift region 11, and more highly doped than the drift region 11. The field-stop region 13 may be located in the drift region 11 close to the drain region 25 (as shown), or may adjoin the drain region 25 (not shown). The drain region 25 is electrically connected to a collector node (collector terminal) C.

According to one embodiment, the transistor device is implemented as an IGBT. In this case, the drain region 25 has the first conductivity type, that is, a conductivity type complementary to the conductivity type of the drift region 11. The IGBT can be implemented as a reverse conducting (RC) IGBT. In this case, there is at least one semiconductor region 26 of the same doping type as the drift region 11, more highly doped than the drift region 11, connected to the collector node and extending through the drain region (collector region) 25 to the drift region 11 or the field-stop region 13, respectively. This optional region 26 is illustrated in dotted lines in FIGS. 1A-1B.

According to another embodiment, the transistor device is implemented as a MOSFET. In this case, the drain region 25 has the second conductivity type, that is, a conductivity type corresponding to the conductivity type of the drift region 11.

According to one embodiment, the first conductivity type is a p-type, and the second conductivity type is an n-type, so that the source region 12 and the drift region 11 are n-doped semiconductor regions and the body region 20 is a p-doped semiconductor region. In this case, the drain region 25 is a p-doped region in an IGBT and an n-doped region in a MOSFET.

The doping concentration of the source region 12 and the drain region 25 is, for example, between $1E16$ cm$^{-3}$ and $1E21$ cm$^{-3}$, and the doping concentration of the drift region 11 is, for example, between $1E12$ cm$^{-3}$ and $1E15$ cm$^{-3}$. The doping concentration of the first body region section 21 (that separates the source region 12 from the drift region 11) is, for example, between $1E15$ cm$^{-3}$ and $5E17$ cm$^{-3}$. In particular, a maximum doping concentration of this first body region section 21 or an average doping concentration of this body region section is between $1E15$ cm$^{-3}$ and $5E17$ cm$^{-3}$. The "average doping concentration" is, for example, the average of the doping concentration along a path that extends in a vertical direction of the semiconductor body 100 from the source region 12 through the body region section 21 to the drift region 11. An exemplary path P is shown in FIG. 2 which is explained in further detail herein below.

For the purpose of explanation it is assumed that the transistor device is implemented as an IGBT. The IGBT shown in FIGS. 1A-1C can be operated like a conventional IGBT by applying a voltage between the collector and emitter terminals C, E and by applying a suitable drive potential to the gate terminal G. The IGBT is in the on-state when a drive potential is applied to the gate terminal G that generates a conducting channel (inversion channel) in the body region 20 between the source region 12 and the drift region 11. In an IGBT that is implemented with an n-type source region 12 and a p-type body region 20, the drive potential to be applied to the gate terminal G in order to switch on the IGBT is positive relative to the source potential (which is the electrical potential of the source region 12 and the emitter terminal E, respectively). The current that flows through the IGBT in the on-state is dependent on a load path voltage applied between the collector and emitter terminal C, E. When the IGBT is in the on-state and when a load path voltage is applied that forward biases a pn-junction between the drain region 25 and the drift region 11, the drain region 25 injects first type charge carriers into the drift region 11 and the source region 12, through the conducting channel in the body region 20, injects second type charge carriers in the drift region 11. The first type charge carriers and the second type charge carriers form a charge carrier plasma in the drift region 11, with this charge carrier plasma resulting in relatively low conduction losses of the IGBT. The first type charge carriers are holes and the second type charge carriers are electrons when the drain region 25 is p-doped and the source region 12 is n-doped.

A MOSFET can be operated basically in the same way, with the difference that a MOSFET is a unipolar device which, in the on-state, only includes one type of charge carriers in the drift region namely charge carriers injected into the drift region 11 by the source region 12.

The conduction losses of an IGBT are dependent on the saturation voltage $V_{CEsat}$. The saturation voltage is the voltage between the collector and emitter terminals (collector emitter voltage) at a typical current (rated current) in the on-state of the IGBT. The saturation voltage $V_{CEsat}$ is mainly dependent on a cross-sectional area of the drift region 11 in a section plane that is perpendicular to the current flow direction of the IGBT and below the trenches 3, 4. In the IGBT shown in FIGS. 1A-1C, the current flow direction corresponds to a vertical direction of the semiconductor body 100. That is, the current flow direction is a direction perpendicular to the surface 101 of the semiconductor mesa region. The cross-sectional area of the drift region 11 is the area of the drift region 11 in a section plane that is parallel to the surface 101. At a given current, the saturation voltage $V_{CEsat}$ can be decreased by designing the IGBT with an increased cross-sectional area of the drift region 11.

The IGBT can be used as an electronic switch for switching a current which flows through a load connected in series with the load path (collector emitter path) of the IGBT. In a normal operation mode, the current through the IGBT is defined by the load, wherein the load and the IGBT may be adapted to one another such that the current through the load is below the rated current of the IGBT, so that in the on-state, the load path voltage of the IGBT is below the saturation voltage $V_{CEsat}$.

However, in case of an error such as, for example, a short-circuit in the load the current through the IGBT may be considerably higher than the rated current. In this case, the collector emitter voltage may increase above the saturation voltage $V_{CEsat}$ and the current through the IGBT is defined by the IGBT. The maximum current that may flow through the IGBT is usually referred to as saturation current $I_{CEsat}$. This saturation current is mainly defined by a channel width of the IGBT. The "channel width" is the width of a conducting channel that is generated by the gate electrode 31 in the body region 20 between the source region 12 and the drift region 11 when a suitable drive potential is applied to the gate electrode 31. In an IGBT that includes several source regions (embodiments of those devices are explained herein below) the channel width is the overall width of the conducting channels between the individual source regions 12 and the drift region 11.

At load path voltages below the saturation voltage $V_{CEsat}$, the channel width substantially corresponds to a length of the source region 12 in the longitudinal direction of the semiconductor mesa region. This is explained in more detail with reference to FIG. 2 which shows a vertical cross sectional view of the semiconductor mesa region in a section plane C-C close to the gate dielectric 32. In FIG. 2, L denotes the length of the source region 12 in the longitudinal direction of the semiconductor mesa region. As mentioned above, at low load path voltages the length L of the source region 12 substantially defines the channel width in the on-state. In FIG. 2, C1 schematically shows the border of the channel region at low load path voltages, and W1 denotes the channel width in this case. Thus, at low load path voltages, second type charge carriers (which are electrons when the source region 12 is n-doped) flow from the source region 12 into the drift region 11 in a conducting channel along the gate dielectric 32, wherein the conducting channel is substantially only below the source region 12.

However, at load path voltages that are considerably higher than the saturation voltage $V_{CEsat}$ the conducting channel along the gate dielectric 32 in the longitudinal direction of the semiconductor mesa region may expand into those regions 22 of the body region 20 that are not directly below the source region 12. That is, the channel region may expand into a section 22 of the body region 20 that adjoins the first body region section 21 in the longitudinal direction of the semiconductor mesa region, unless suitable measures are taken. The section 22 that adjoins the first body region section 21 in the longitudinal direction of the semiconductor mesa region will be referred to as second body region section 22 in the following. An expansion of the channel region at high load path voltages results in an increase of the channel width and, therefore, an increase of the saturation current $I_{CEsat}$. It is therefore desirable, to confine the conducting channel in the on-state of the IGBT to the first body region section 21 directly below the source region 12, so that, even at high load path voltages, the channel width substantially corresponds to the length L of the source region 12, and the saturation current $I_{CEsat}$ is substantially based on the length L of the source region 12. Thus, the saturation current $I_{CEsat}$ can be adjusted by suitably adjusting the length L of the source region 12.

According to one embodiment, confining the channel to the first body region section 21 is obtained by providing the surface region 23 above the second body region section 22. The surface region 23 adjoins the first surface 101 and has a doping concentration which is at least 10 times the doping concentration in the first body region section 21 which separates the source region 12 from the drift region 11. According to one embodiment, a minimum doping concentration of the surface region 23 is between 1E18 cm$^{-3}$ and 1E20 cm$^{-3}$. The doping concentration of the second body region section 22 may correspond to the doping concentration of the first body region section 21.

According to one embodiment, the surface region 23 extends less deep into the semiconductor body 100 than the source region 12. According to one embodiment, a depth of the source region 12 is at least twice the depth of the surface region 23. According to one embodiment, a depth of the source region 12 is between 300 nanometers and 400 nanometers and a depth of the surface region is between 150 nanometers and 250 nanometers.

The positive effect stated above of providing the surface region 23 can be seen from FIG. 3 that shows the collector-emitter current above the collector-emitter voltage of two IGBTs that have identical typologies and that are only different in that one IGBT has a surface region as explained with reference to FIGS. 1A-10 and 2, while in the other IGBT the highly doped surface region 23 is omitted so that a section of the body region adjoins the surface 101 that has a doping concentration substantially corresponding to the doping concentration in the first body region section 21. Referring to FIG. 3, the emitter-collector current has a region where it increases as the collector-emitter voltage increases and then saturates so that it does not substantially increase any further as the collector-emitter voltage further increases. Referring to FIG. 3, the saturation current of the IGBT without surface region 23 (see curve 202) is significantly higher than the saturation current of the IGBT with the higher doped surface region 23 (see curve 201). The reason is that in the IGBT with the surface region 23, the surface region 23 helps to confine the channel region to below the source region 12 so that at higher load path voltages there is no increase of the channel width and, therefore, no increase of the saturation current $I_{CEsat}$. Thus, in the IGBT with the surface region 23, substantially, the saturation current can be adjusted by suitably adjusting the length of the source region 12 in the longitudinal direction of the semiconductor mesa region.

Referring to FIGS. 1A-1C, the second trench 4 includes a further electrode 41 and a further dielectric 42. The further dielectric 42 electrically insulates the further electrode 41 from the semiconductor body 100. According to one embodiment, the further electrode 41 is a field electrode that is electrically connected to the emitter terminal E. This connection of the field electrode 41 to the emitter terminal E is shown in solid lines in FIG. 1A. According to another embodiment which is illustrated in dotted lines in FIG. 1A, the further electrode 41 is a further gate electrode and a further dielectric 42 is a further gate dielectric. In this case, the further electrode 41 is electrically connected to the gate terminal G of the IGBT. In this case, in the on-state of the IGBT, there are conducting channels along both sidewalls of the mesa region, namely along the gate dielectric 32 in the first trench 3 and along the gate dielectric 42 in the second trench 4. In the first embodiment, the channel width substantially corresponds to the length L of the source region 12. In the second embodiment, the channel width substantially corresponds to two times the lengths (=2 L) of the source region 12.

FIG. 4, illustrates one embodiment of how the body region 20 and the source region 12 can be connected to the emitter terminal E. In this embodiment a third trench extends from the surface 101 of the mesa region through the source region 12 into the body region 20. A contact electrode 51 is located in the third trench and is electrically connected to the source region 12 along the sidewalls of the third trench, and the body region 12 along the sidewalls and the bottom of the third trench. Optionally, the body region 20 includes a contact region 24 that is more highly doped than surrounding regions of the body region 20 and that adjoins the contact electrode 51. The doping concentration of the contact region 24 is, for example, between 1E19 $cm^{-3}$ and 1E21 $cm^{-3}$.

In the longitudinal direction of the semiconductor mesa region, the third trench with the contact electrode 51 may extend along the length of the semiconductor mesa region. This is illustrated in FIG. 5 which shows a top view of the IGBT shown in FIG. 4.

Figure 6:
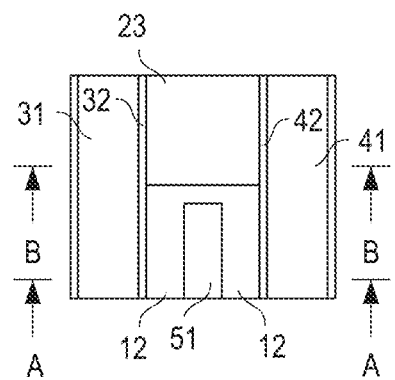
FIG. 6 shows a top view of another embodiment of the transistor device shown in FIG. 4.

According to another embodiment which is shown in FIG. 6, the third trench with the contact electrode 51 is substantially located in the source region 12 and the first body region section 21, but does not extend into the second body region section 22 and the surface region 23, respectively.

Figure 7:
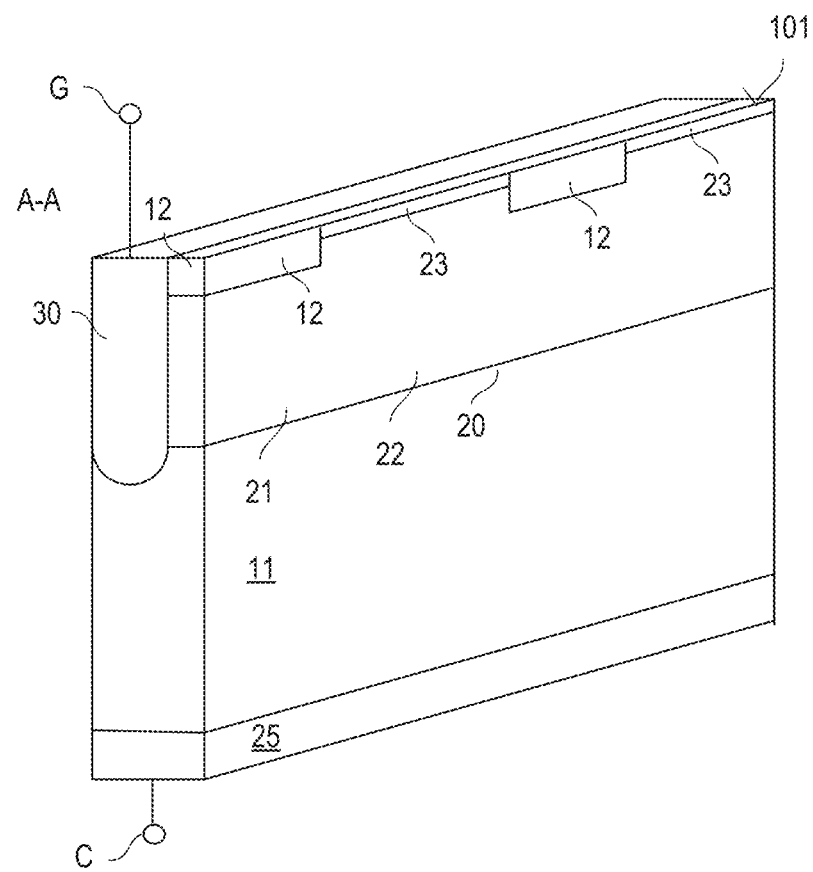
FIG. 7 illustrates a perspective cross sectional view of a transistor device according to one embodiment.

FIG. 7 shows a perspective cross sectional view of one section of an IGBT that includes several source regions 12 in one semiconductor mesa region. In the longitudinal direction of the semiconductor mesa region, the individual source regions 12 are separated by the second body region sections 22 and the surface regions 23, respectively. The channel width of the IGBT can be adjusted by suitably adjusting the lengths of the individual source regions 12 and the lengths of the surface regions 23, respectively. According to one embodiment, the source regions 12 are shorter than the surface regions 23. According to one embodiment, a ratio between the length of the source region 12 and the length of an adjacent surface region 23 is between 1:0.5 and 1:20, in particular between 1:2 and 1:10.

Figure 8:
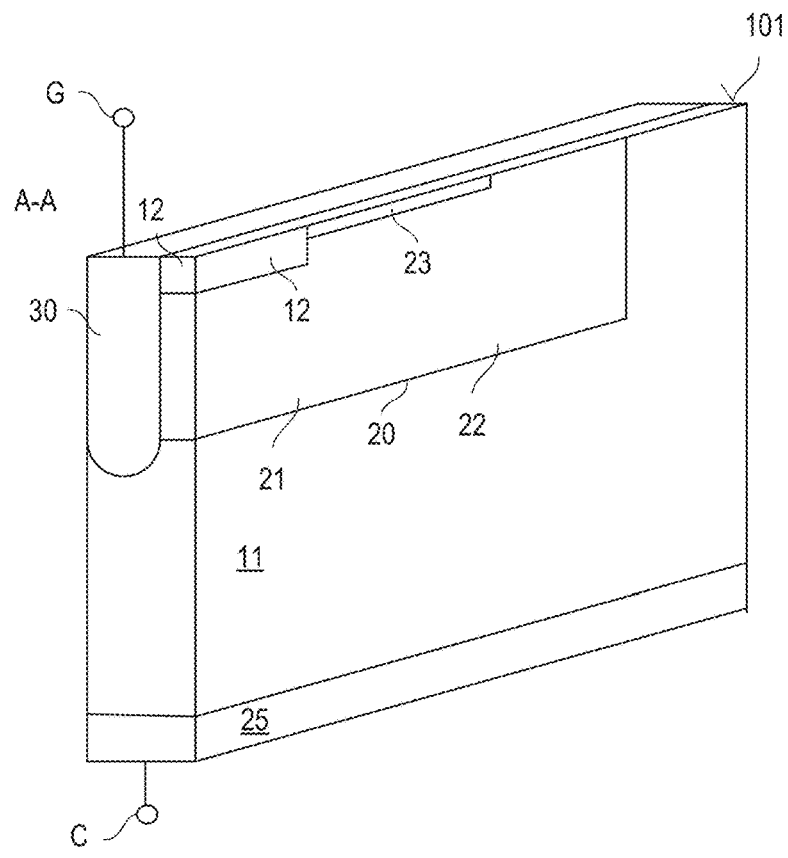
FIG. 8 illustrates a perspective cross sectional view of a transistor device according to one embodiment.

FIG. 8 shows a perspective cross sectional view of an IGBT according to another embodiment. In this embodiment, the drift region 11 extends to the surface of the semiconductor mesa region adjacent the body region 20. In the longitudinal direction of the semiconductor mesa region, the surface region 23 does not extend to the drift region 11 but is separated from the drift region 11 by a body region section that is lower doped than the surface region 23.

Figure 9:
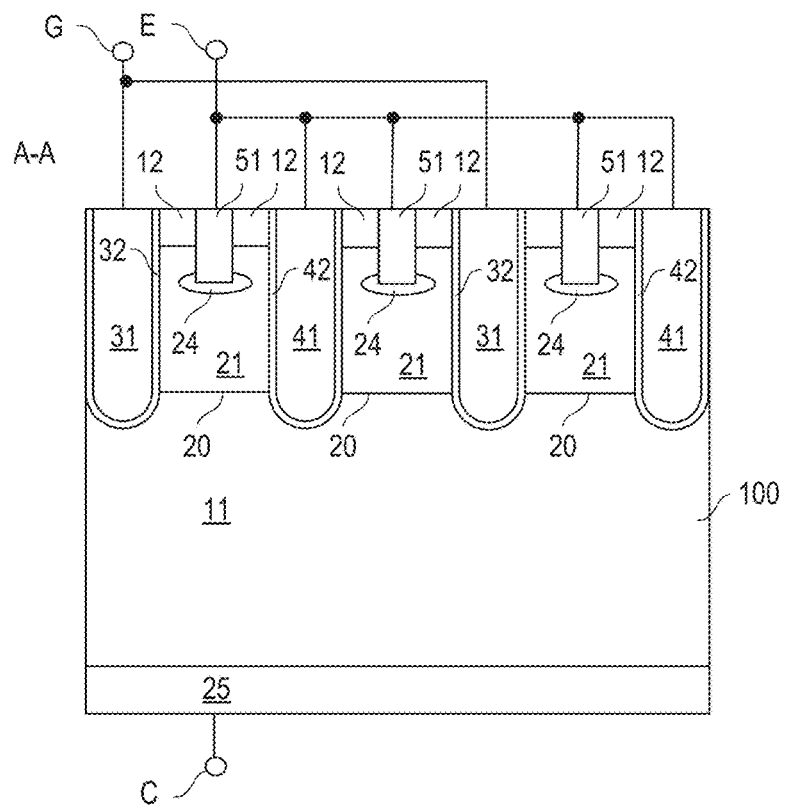
FIG. 9 shows a vertical cross sectional view of a transistor device according to a further embodiment.

As stated above, the saturation current $I_{CEsat}$ of the IGBT with the at least one surface region 23 is dependent on the length of the at least one source region 12. According to one embodiment which is shown in FIG. 9, the IGBT includes several semiconductor mesa regions and several trenches with gate electrodes. FIG. 9 shows a vertical cross sectional view of one section of an IGBT that includes several semiconductor mesa regions. Specifically, FIG. 9 shows three semiconductor mesa regions, wherein each semiconductor mesa region adjoins a first trench with a gate electrode 31 and a gate electrode dielectric 32 on one side and a second trench with a field electrode 41 connected to the emitter node E and field electrode dielectric 42 on the other side. In this embodiment, the overall channel width of the IGBT substantially defined by the overall length of the source regions 12 in one semiconductor mesa region multiplied with the number of semiconductor mesa regions. In the embodiment shown in FIG. 9, each semiconductor mesa region includes a contact electrode 51 that is electrically connected to the source region 12 and the body region 20 in the respective semiconductor mesa region. In this embodiment, each of the semiconductor mesa regions is an active semiconductor mesa region. That is, in the on-state of the IGBT, there is at least one conducting channel along the gate dielectric 32 in each semiconductor mesa region.

FIG. 10 shows a vertical cross sectional view of an IGBT that includes active semiconductor mesa regions and inactive semiconductor mesa regions. In this embodiment, there are four second trenches with field electrodes 41 and field electrode dielectrics 42 between two first trenches with gate electrodes 31 and gate electrode dielectrics 32. The semiconductor mesa regions adjoining one first trench with one gate electrode 31 and one gate electrode dielectric 32 on opposite sides are active semiconductor mesa regions, while those semiconductor mesa regions between two second trenches are inactive semiconductor mesa regions. In the embodiment shown in FIG. 10, there are three inactive semiconductor mesa regions arranged between two pairs of active semiconductor mesa regions. The inactive semiconductor mesa regions may include a semiconductor region 21' of the first conductivity type. The doping of these semiconductor regions 21' may correspond to the doping of the first body region section 21.

According to one embodiment, the semiconductor regions 21' in the inactive semiconductor mesa regions are floating. According to another embodiment, these regions 21' are connected to the emitter terminal E such that the electrical potential of these regions 21' substantially corresponds to the electrical potential of the emitter terminal E, and such that no significant current can flow between the regions 21' and the emitter terminal E. This can be obtained by providing a high-ohmic contact between the emitter terminal E and the regions 21', or by providing a contact between the emitter terminal E and the regions 21' that has a small area compared to the area of the regions 21'.

In the embodiment shown in FIG. 10, an active semiconductor mesa region is located on both sides of a first trench. However, this only an example. According to another embodiment an active semiconductor mesa region is adjacent only one side of a first trench with a gate electrode 31 and a gate electrode dielectric 32.

The IGBT may include a plurality of the structures shown in FIG. 10, that is a plurality of structures including 2a-3i-2a-3i . . . where 2a denotes two adjacent active (a) semiconductor mesa regions and 3i denotes adjacent three inactive (i) semiconductor mesa regions. In general, the IGBT may include a plurality of structures including ka-hi-ka-hi . . . where k denotes the number of adjacent active (a) semiconductor mesa regions and h denotes the number of adjacent inactive (i) semiconductor mesa regions. Although FIG. 10 shows the electrodes 41 to be connected to the emitter terminal E, it is also possible to connect these electrodes 41 to the gate terminal G. Moreover, it is even possible to connect some of the electrodes 41 to the emitter terminal E and to connect others of these electrodes 41 to the gate terminal G.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A transistor device, comprising:
    a semiconductor mesa region between a first trench and a second trench in a semiconductor body, wherein the semiconductor mesa region comprises an upper surface extending between the first trench and the second trench, wherein the semiconductor mesa region comprises a body region of a first conductivity type, a source region of a second conductivity type directly contacting the first trench, and a surface region of the first conductivity type, the surface region having a higher doping concentration than the body region,
    a drift region of the second conductivity type in the semiconductor body;
    a gate electrode adjacent the body region in the first trench, and dielectrically insulated from the body region by a gate dielectric; and
    a contact plug arranged in a third trench extending from the upper surface of the semiconductor mesa region through the source region into the body region;
    wherein, in a depth direction of the semiconductor mesa that extends perpendicular to the upper surface: the source region and the surface region each extend from the upper surface to the body region,
    wherein, in a length direction of the semiconductor mesa that is perpendicular to the depth direction and is parallel to sidewalls of the first and second trenches: the surface region is disposed behind the source region and directly contacts the first trench, and wherein a bottommost surface of the source region is spaced further apart from the upper surface than a bottommost surface of the surface region.

2. The transistor device of claim 1, further comprising:
    another gate electrode dielectrically insulated from the body region by another gate dielectric in the second trench.

3. The transistor device of claim 1, further comprising:
    a field electrode arranged in the second trench, and dielectrically insulated from the semiconductor body by a field electrode dielectric,
    wherein the field electrode is electrically connected to the source region.

4. The transistor device of claim 1, wherein a doping concentration of the surface region is at least 10 times a maximum doping concentration of the body region.

5. The transistor device of claim 1, wherein a minimum doping concentration of the surface region is at least 10 times an average doping concentration of the body region.

6. The transistor device of claim 1, wherein a minimum doping concentration of the surface region is between 1E18 $cm^{-3}$ and 1E20 $cm^{-3}$.

7. The transistor device of claim 1, wherein a maximum doping concentration of the body region section is between 1E15 $cm^{-3}$ and 5E17 cm 3.

8. The transistor device of claim 1, wherein a depth of the surface region in the depth direction of the semiconductor mesa region is between 150 nanometers and 250 nanometers.

9. The transistor device of claim 1, wherein a ratio between a depth of the source region and a depth of the surface region is at least 2.

10. The transistor device of claim 1, further comprising:
    a contact region of the first conductivity type in the body region,
    wherein the contact region has a higher doping concentration than those regions of the body region that adjoin the contact region.

11. The transistor device of claim 1, further comprising:
    at least one further semiconductor mesa region separated from the semiconductor mesa region by one of the first and second trenches and arranged between the one of the first and second trenches and a fourth trench, wherein the at least one further semiconductor mesa region comprises a semiconductor region of the first conductivity type.

12. The transistor device of claim 11, wherein the semiconductor region of the first conductivity type is floating.

13. The transistor device of claim 11, wherein the semiconductor region of the first conductivity type is coupled to a terminal which is connected to the source region.

14. The transistor device of claim 11, further comprising:
a field electrode arranged in the fourth trench, and dielectrically insulated from the semiconductor body by a field electrode dielectric,
wherein the field electrode is electrically connected to the source region.

15. The transistor device of claim 1, wherein a section of the drift region extends to the upper surface of the semiconductor mesa region adjacent the surface region.

16. The transistor device of claim 1, further comprising:
a drain region which is separated from the body region by the drift region.

17. The transistor device of claim 16, wherein the drain region is of the first conductivity type.

18. The transistor device of claim 17, further comprising:
a semiconductor region of the second conductivity type extending through the drain region.

19. The transistor device of claim 16, wherein the drain region is of the second conductivity type.

20. The transistor device of claim 1, wherein the semiconductor mesa region further comprises a second source region of the second conductivity type, wherein, in the depth direction of the semiconductor mesa, the second source region extends from the upper surface to the body region, and wherein, along the length direction, the surface region extends from the source region to the second source region.

21. The transistor device of claim 20, wherein, in a section of the semiconductor mesa region that is behind the third trench in the length direction, the surface region extends from the first trench to the second trench.

22. The transistor device of claim 21, wherein the semiconductor mesa region further comprises a third source region and a second surface region, wherein, in the depth direction of the semiconductor mesa, the third source region and the second surface region extend from the upper surface to the body region, and wherein the third source region and the second surface region each directly adjoin and extend along a sidewall of the second trench in the length direction.

23. The transistor device of claim 1, wherein the source regions are shorter in the length direction than the surface region.

24. The transistor device of claim 23, wherein the surface region is immediately adjacent to the source region, and wherein a ratio between the length of the source region and the length of the surface region is between 1:2 and 1:10.

25. A transistor device, comprising:
a semiconductor mesa region between a first trench and a second trench in a semiconductor body, wherein the semiconductor mesa region comprises an upper surface extending between the first trench and the second trench, wherein the semiconductor mesa region comprises a body region of a first conductivity type, a source region of a second conductivity type directly contacting the first trench, and a surface region of the first conductivity type, the surface region having a higher doping concentration than the body region,
a drift region of the second conductivity type in the semiconductor body;
a gate electrode adjacent the body region in the first trench, and dielectrically insulated from the body region by a gate dielectric; and
a contact plug arranged in a third trench extending from the upper surface of the semiconductor mesa region through the source region into the body region;
a contact region of the first conductivity type in the body region directly contacting the contact plug at a bottom of the third trench, the contact region having a higher doping concentration than the body region,
wherein, in a depth direction of the semiconductor mesa that extends perpendicular to the upper surface: the source region and the surface region each extend from the upper surface to the body region,
wherein, in a length direction of the semiconductor mesa that is perpendicular to the depth direction and is parallel to sidewalls of the first and second trenches: the surface region is disposed behind the source region and directly contacts the first trench, and wherein the contact region is separated from the surface region by a portion of the body region.

26. The transistor device of claim 25, wherein the source region extends deeper into the semiconductor mesa region from the upper surface of the semiconductor mesa region than the surface region.

* * * * *

UNITED STATES PATENT AND TRADEMARK OFFICE
CERTIFICATE OF CORRECTION

PATENT NO. : 10,608,104 B2
APPLICATION NO. : 14/228881
DATED : March 31, 2020
INVENTOR(S) : A. Philippou et al.

Page 1 of 1

It is certified that error appears in the above-identified patent and that said Letters Patent is hereby corrected as shown below:

In the Claims

Column 10, Line 49 (Claim 7, Line 3) please change "cm 3" to -- $cm^{-3}$ --

Signed and Sealed this
Twelfth Day of May, 2020

Andrei Iancu
*Director of the United States Patent and Trademark Office*